(12) United States Patent
Haywood

(10) Patent No.: US 9,570,146 B1
(45) Date of Patent: Feb. 14, 2017

(54) ALTERNATE ACCESS TO DRAM DATA USING CYCLE STEALING

(71) Applicant: Rambus Inc., Sunnyvale, CA (US)

(72) Inventor: Christopher Haywood, Westlake Village, CA (US)

(73) Assignee: Rambus Inc., Sunnyvale, CA (US)

( * ) Notice: Subject to any disclaimer, the term of this patent is extended or adjusted under 35 U.S.C. 154(b) by 296 days.

(21) Appl. No.: 14/181,422

(22) Filed: Feb. 14, 2014

Related U.S. Application Data

(60) Provisional application No. 61/770,274, filed on Feb. 27, 2013.

(51) Int. Cl.
*G06F 13/12* (2006.01)
*G06F 13/38* (2006.01)
*G11C 11/406* (2006.01)

(52) U.S. Cl.
CPC ............................... *G11C 11/40622* (2013.01)

(58) Field of Classification Search
None
See application file for complete search history.

(56) References Cited

U.S. PATENT DOCUMENTS

| 6,603,694 | B1* | 8/2003 | Frankowsky | G11C 11/406 365/222 |
| 2005/0041520 | A1* | 2/2005 | Takahashi | G11C 8/18 365/233.1 |
| 2005/0232049 | A1* | 10/2005 | Park | G11C 11/406 365/222 |
| 2007/0195627 | A1* | 8/2007 | Kim | G11C 11/406 365/222 |
| 2012/0151131 | A1* | 6/2012 | Kilmer | G11C 11/406 711/106 |
| 2014/0281202 | A1* | 9/2014 | Hunter | G11C 11/40611 711/106 |

\* cited by examiner

*Primary Examiner* — Elias Mamo
(74) *Attorney, Agent, or Firm* — Lowenstein Sandler LLP

(57) ABSTRACT

A method for operating a DRAM is provided. The method includes initializing a dynamic random access memory ("DRAM") array from a host controller, which is coupled to the DRAM array. The method includes isolating the dynamic random access memory array from a host controller and allowing a host computer to wait for a selected time period greater than the tRFC to define an alternate access time. The method includes initiating an access command to the DRAM array during the alternate access time.

20 Claims, 2 Drawing Sheets

ALTERNATE ACCESS TO DRAM DATA USING CYCLE STEALING

CROSS-REFERENCE

This present application claims priority to U.S. Ser. No. 61/770,274, filed Feb. 27, 2013, commonly assigned, and hereby incorporated by reference herein.

BACKGROUND

The present invention relates generally to memory systems, and more particularly to computer systems, which include memories systems with interfaces. Merely by way of example, the present memory system is a double data rate (DDR) DRAM device or array, although there can be variations.

SUMMARY

The present invention is directed to memory systems. Merely by way of example, the present invention can be applied to double data rate (DDR) DRAM memory devices and arrays, although there can be variations.

A method for operating a DRAM is provided. The method includes initializing a dynamic random access memory ("DRAM") array from a host controller, which is coupled to the DRAM array. The method includes isolating the dynamic random access memory array from a host controller and allowing a host computer to wait for a selected time period greater than the required tRFC, Row Refresh Cycle Timing, as provided by a certain JEDEC specification, to define an alternate access time, which is separate from an access time. The method includes initiating commands to access the DRAM array during the alternate access time, which is included in a programmed or expanded tRFC time sequence.

These and other features, aspects, and advantages of the present invention will become better understood with reference to the following description and claims.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1:
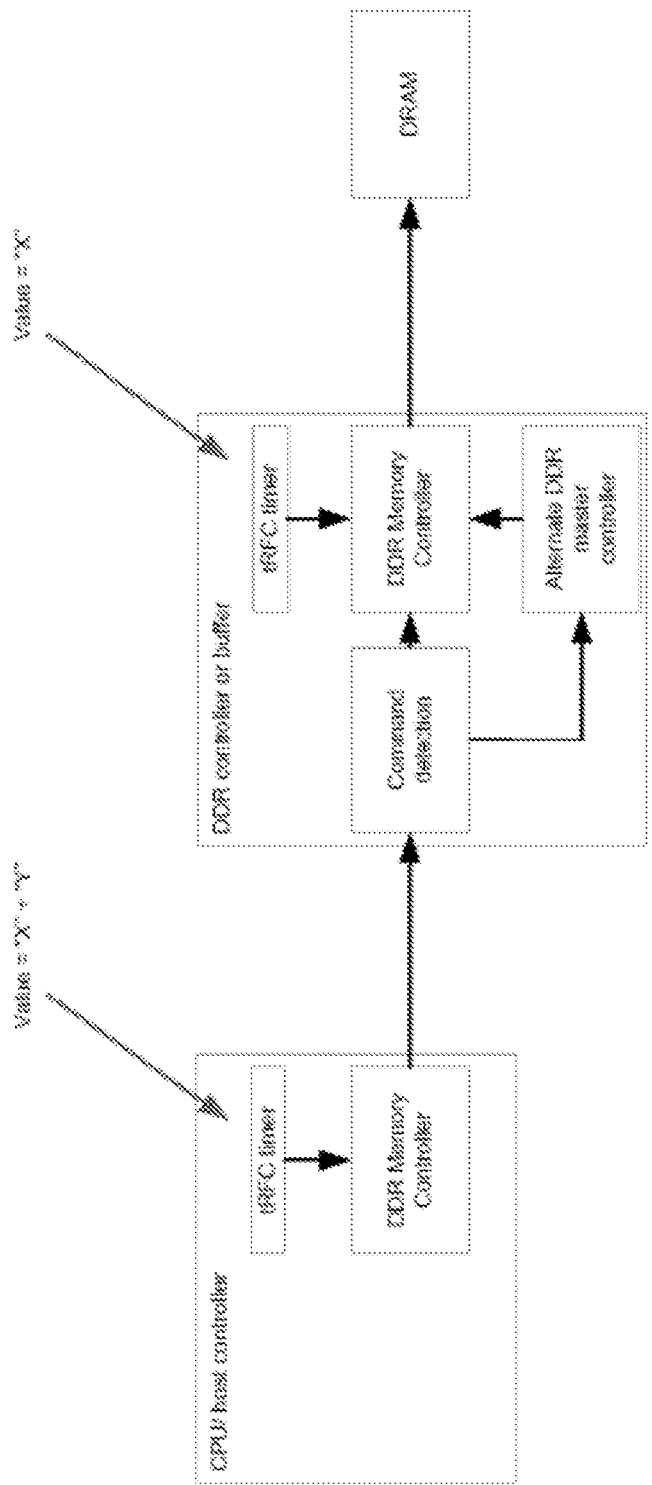
FIG. 1 is a simplified block diagram of a memory system according to an embodiment of the present invention.

The present invention relates generally to memory systems. In various embodiments, the DRAM chips are referred to hereinafter as DDR DRAM, though the invention is not limited to any specific DRAM memory chip type or technology. Further the technique can apply to any memory technology that has a requirement for a periodic repeated operation that can be implemented as a host memory controller timer or event.

In an example, conventional central processing units, commonly termed "CPUs" using embedded or other DDR controllers for attachment of DRAM memory, usually in a DIMM form factor, are masters of the DDR bus for all timing, functions and operations. It is currently not possible or difficult for any other devices to exist on the DDR bus to perform any operation without the risk of collision with CPU originated cycles. The described mechanism allows deviation from this unwritten rule, and is embodied in memory buffers with auxiliary ports, among other features.

In an example, CPU's often support the various commands that are desirable for DRAM training (calibration at power on) and maintenance during normal operations such as refresh at intermittent re-calibration in addition to the normal commands associated with data reads and writes as well as power management.

A cycle stealing mechanism can make use of any repetitive cycle that has programmable characteristics provided the DRAM is in a known state. The best example of this is the refresh command as the host has to be able to support different DRAM densities each of which have different requirements for tRFC, or refresh cycle time, the amount of time that a DRAM needs to spend performing an internal refresh operation. However, other DRAM commands can also be utilized in differing architectures based on implementation of the programmable characteristics.

In order to implement the mechanism for "cycle stealing" during refresh an external DDR controller or buffer that has the capability to isolate the DRAM array from the system bus has programmable registers which define the DRAM parameters needed to be satisfied for correct operation, in this example tRFC. This is normally controlled by the host CPU memory controller configuration but during operation when cycle stealing operations can be used this counter is increased by a small amount. So the available bandwidth available for an alternate access to DRAM is calculated by the difference of the host tRFC and the external DDR controller tRFC setting multiplied by the repeat rate of the refresh cycles. The host CPU setting could be fixed so that a certain amount of bandwidth is reserved for the external DDR controller or buffer, or it could be dynamic so that the setting is adjusted if the host controller knows that the external controller or buffer needs some access time.

In addition it is likely that all DRAM designs have different requirements for the various cycles but are specified to work at the JEDEC standard timings. In this case for the refresh example the DDR controller or buffer could have a lower value for tRFC as a function of DRAM parameters (as opposed to DRAM specs) and therefore more bandwidth would be available.

In order for the DDR controller or buffer to recognize that it can access the bus it is required to have some logic that can detect the host command. This is best implemented as a set of mask and compare registers such that any pattern of 1's, 0's or don't care bits can be detected on the incoming command word from the host. It would be normal for several sets of these to be used in parallel.

Once the command detect logic has received a matched pattern it will use an internal programmable timer to wait for the required time needed by the DRAM for it's internal operation, wither to a specified value or to a value that can be determined for a particular DRAM architecture. After this time has expired the DDR controller or buffer is free to use the DRAM bus as a master for the available extra time controlled by a second timer value. At the end of this time the DRAM will be put back into the state expected by the host that was existing before the command was issued.

It is a natural consequence of this scheme that there will be some affect on the available bandwidth of the DDR bus to the host CPU or controller as increasing tRFC will reduce the available normal access time, however, it is anticipated that the alternate master is performing an operation that would normally use CPU time as well as DDR bus bandwidth and this operation becomes a more efficient overall operation.

There are other DRAM command that have similar characteristics to refresh that could be used to implement extra available bandwidth to augment the example scheme proposed here or provide lower a different bandwidth capability. In addition it is possible to implement custom commands that could be specific to alternate master control. These would use parallel command detection circuits.

Referring to FIG. 1, the system includes a host controller or CPU, central processing unit. In an example, the CPU can be one manufactured and designed by Intel Corporation, among others. The CPU communicates to an interface integrated circuit, or buffer. The interface integrated circuit configured to operate a dynamic random access memory ("DRAM") device, which can be one of a plurality of devices on an array or in a DIMM format. In an example, the interface device has a command detection configured to receive a command from a host controller for initializing a dynamic random access memory ("DRAM") array. The command detection communicates between a DDR memory controller or alternate DDR master controller, as shown. In an example, the interface device is configured to isolate the dynamic random access memory array from a host controller.

Figure 2:
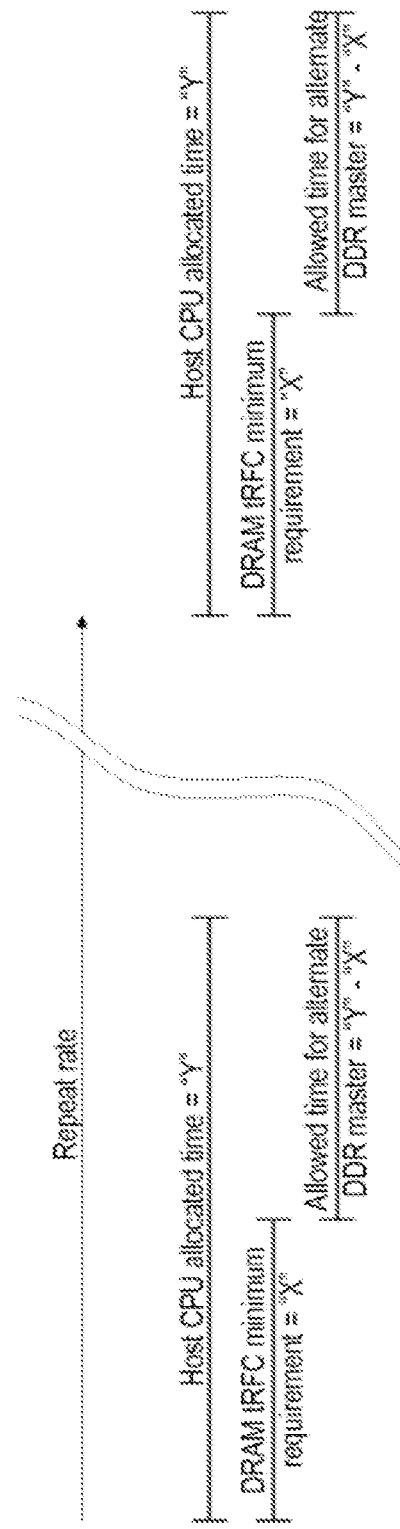
FIG. 2 is a simplified timing diagram of a memory system according to an embodiment of the present invention.

In an example, the DDR memory controller configured for initiating a refresh cycle for a rank within the dynamic access memory array. In an example, the controller allows the host memory controller to wait, during the refresh cycle, for a selected time period greater than the tRFC or any other programmable parameter to define an alternate access time provided within a designated allocated time initiating from a first time to a second time such that the designated allocated time is defined by Y, while the alternative access time is defined by Y-X, where X is defined as tRFC, see for example, FIG. 2. The interface device also has a tRFC timer coupled to the DDR memory controller and the alternative DDR master controller coupled to the DDR memory controller and configured for initiating one or any of a plurality of access commands to the DRAM array during the alternate access time to operate the DRAM array.

In an example, the present invention provides a method for operating a dynamic random access memory ("DRAM") device. The method includes initializing a dynamic random access memory ("DRAM") array from a host controller, which is coupled to the DRAM array that comprises a bank or plurality of banks. The method includes isolating the dynamic random access memory array from a host controller, and initiating a refresh cycle for a rank within the dynamic access memory array. The method includes allowing a host memory controller to wait, during the refresh cycle, for a selected time period greater than the tRFC or any other programmable parameter to define an alternate access time provided within a designated allocated time initiating from a first time to a second time such that the designated allocated time is defined by Y, while the alternative access time is defined by Y-X, where X is defined as tRFC. The method also includes initiating one or any of a plurality of access commands to the DRAM array from an alternate master device during the alternate access time to operate the DRAM array.

In an example, the isolating, allowing, and initiating are provided in a memory buffer integrated circuit, the memory buffer integrated circuit comprising a tRFC timer, a DDR memory controller, an alternative DDR master controller, and a command direction. In an example the isolating, allowing and initiating are provided in a memory controller integrated circuit such that an address information, command information, and data are isolated from the host controller, while allowing communications using the one or more access commands between the DRAM array and other storage, processing, or communication devices. The initiating is provided by an alternate master controller provided within a memory buffer integrated circuit or a memory controller integrated circuit; wherein the alternative access time ranges from 1 ns to 300 ns, although there can be variations, in an example. In an example, the method is provided during normal operational mode of the DRAM array to allow the one or any of the plurality of access commands to the DRAM array during the designated allocated time, including the tRFC. In an example, the method also includes detecting a timing of a refresh (or other) cycle using command logic. In an example, the access command is a read command or a write command such that data from either the read command or the write command is transferred to a non-volatile memory coupled to the memory buffer or controller, the non-volatile memory comprises a Flash memory device. In an example, the access command is a read command or a write command such that data from either the read command or the write command is transferred to any auxiliary port coupled to the memory buffer or controller, and resetting an operation of the DRAM array.

In an example, the alternate access time can be split so that a first portion of the alternate access time is available before the refresh command is sent to the DRAM and then a second portion or the rest of the alternate access time continues tRFC later. In an example, the DRAM refreshes are always postponed or delayed by the first portion of the alternate access time, although there can be variations.

The embodiments of the invention described herein are exemplary and numerous modifications, variations and rearrangements can be readily envisioned to achieve substantially equivalent results, all of which are intended to be embraced within the spirit and scope of the invention as defined in the appended claims. As used herein, the term "stealing" or "cycle stealing" is indicative of using a portion of a cycle for an additional operation, although there may be other meanings and interpretations known to one of ordinary skill in the art.

What is claimed is:

1. A method of operating a dynamic random access memory (DRAM) array, including a process for stealing a portion of a cycle, the method comprising:
   detecting a refresh cycle command received from a host controller coupled to the DRAM array;
   initiating a refresh cycle of a rank of the DRAM array;
   isolating the DRAM array from the host controller for a first time period allocated by the host memory controller for the refresh cycle command, wherein the first time period is greater than a second time period given by a refresh cycle time (tRFC) of the DRAM array; and
   initiating an access command to the DRAM array during an alternate access time defined by a time period within the first time period after initiating the refresh cycle that is not during the refresh cycle.

2. The method of claim 1 wherein the isolating, and initiating are provided in a memory buffer integrated circuit.

3. The method of claim 1 wherein the isolating, allowing and initiating are provided in a memory controller integrated circuit.

4. The method of claim 1 wherein the initiating is provided by an alternate master controller provided within a memory buffer integrated circuit or a memory controller integrated circuit.

5. The method of claim 1 wherein the method is provided during normal operational mode of the DRAM array.

6. The method of claim 1 further comprising detecting a timing of a refresh cycle using command logic.

7. The method of claim 1 wherein the access command is a read command or a write command such that data from either the read command or the write command is transferred to a non-volatile memory coupled to the memory buffer or controller.

8. The method of claim 1 wherein the access command is a read command or a write command such that data from either the read command or the write command is transferred to any auxiliary port coupled to the memory buffer or controller.

9. The method of claim 8 wherein the non-volatile memory is a Flash memory.

10. The method of claim 1 further comprising resetting an operation of the DRAM array.

11. The method of claim 1 wherein the alternate access time is programmatically variable according to the one or more parameters of a port connected to an alternate access master device.

12. A method for operating a dynamic random access memory ("DRAM") device, the method comprising:
   initializing a dynamic random access memory ("DRAM") array from a host controller, the host controller being coupled to the DRAM array;
   isolating the DRAM array from host controller for a first time period allocated by the host memory controller for the refresh cycle command, wherein the first time period is greater than a second time period given by a refresh cycle time (tRFC) of the DRAM array;
   initiating a refresh cycle for a rank within the DRAM array;
   and
   initiating an access command to the DRAM array from an alternate master device during an alternate access time, wherein the alternative access time is a time period within the first time period that is not during the refresh cycle.

13. The method of claim 12 wherein the isolating and initiating are provided in a memory buffer integrated circuit, the memory buffer integrated circuit comprising a tRFC timer, a DDR memory controller, an alternative DDR master controller, and a command direction.

14. The method of claim 12 wherein the isolating and initiating are provided in a memory controller integrated circuit such that an address information, command information, and data are isolated from the host controller.

15. The method of claim 12 wherein the initiating is provided by an alternate master controller provided within a memory buffer integrated circuit or a memory controller integrated circuit; wherein the alternative access time ranges from 1 ns to 300 ns.

16. The method of claim 12 wherein the method is provided during normal operational mode of the DRAM array to allow the one or any of the plurality of access commands to the DRAM array during the first time period allocated by the host memory controller, including the tRFC.

17. The method of claim 12 further comprising detecting a timing of a refresh cycle using command logic.

18. The method of claim 12 wherein the access command is a read command or a write command such that data from either the read command or the write command is transferred to a non-volatile memory coupled to the memory buffer or controller, wherein the non-volatile memory comprises a Flash memory device.

19. The method of claim 12 wherein the access command is a read command or a write command such that data from either the read command or the write command is transferred to an auxiliary port coupled to the memory buffer or controller, and resetting an operation of the DRAM array.

20. An integrated circuit to operate a dynamic random access memory ("DRAM") device, the integrated circuit comprising:
   a command direction detection unit to receive a command from a host controller;
   a DRAM memory controller to:
   isolate the DRAM array from the host controller; and
   initiate a refresh cycle for a rank within the DRAM array for a first time period allocated by the host memory controller for the refresh cycle command, wherein the first time period is greater than a second time period given by a refresh cycle time (tRFC) of the DRAM array;
   a tRFC timer coupled to the DDR memory controller;
   an alternative DDR master controller coupled to the DDR memory controller to initiate an access command to the DRAM array during an alternate access time defined by a time period within the first time period that is not during the refresh cycle.

* * * * *